United States Patent [19]

Koetzle

[11] Patent Number: 5,393,451
[45] Date of Patent: * Feb. 28, 1995

[54] HIGH TEMPERATURE FLASHPOINT, STABLE CLEANING COMPOSITION

[76] Inventor: A. Richard Koetzle, 32 Lucinda La., Rochester, N.Y. 14626

[*] Notice: The portion of the term of this patent subsequent to May 12, 2009 has been disclaimed.

[21] Appl. No.: 243,734

[22] Filed: May 17, 1994

Related U.S. Application Data

[63] Continuation of Ser. No. 881,251, May 11, 1992, abandoned, which is a continuation-in-part of Ser. No. 640,219, Jan. 11, 1991, Pat. No. 5,112,516.

[51] Int. Cl.$^6$ ............................ C11D 7/26; C11D 7/50; C23G 5/032
[52] U.S. Cl. ..................................... 252/170; 134/38; 134/39; 134/40; 252/153; 252/162; 252/171; 252/364; 252/542; 252/DIG. 8
[58] Field of Search .............. 252/153, 162, 170, 171, 252/364, 542, DIG. 8; 134/38, 39, 40

[56] References Cited

U.S. PATENT DOCUMENTS

| | | | |
|---|---|---|---|
| 3,700,740 | 10/1972 | Mourier | 203/42 |
| 3,915,880 | 10/1975 | Sepulveda | 252/99 |
| 4,294,729 | 10/1981 | Bakos et al. | 252/171 |
| 4,336,024 | 6/1982 | Denissenko | 8/142 |
| 4,414,128 | 11/1983 | Goffinet | 252/111 |
| 4,469,848 | 9/1984 | Hooper et al. | 252/106 |
| 4,511,488 | 4/1985 | Matta | 252/162 |
| 4,576,728 | 3/1986 | Stoddart | 252/517 |
| 4,600,522 | 7/1986 | Grzeskowiak, Jr. | 252/170 |
| 4,735,626 | 4/1988 | Smith et al. | 8/137 |
| 4,767,563 | 8/1988 | de Buzzaccarini | 252/174.25 |
| 4,783,283 | 11/1988 | Stoddart | 252/173 |
| 4,797,231 | 1/1989 | Schumann et al. | 252/171 |
| 4,960,236 | 10/1990 | Hedges et al. | 228/180.1 |
| 4,983,224 | 1/1991 | Mombrun et al. | 252/170 |
| 5,102,566 | 4/1992 | Fetterman, Jr. et al. | 252/51.5 R |
| 5,112,516 | 5/1992 | Koetzle | 252/162 |
| 5,156,760 | 10/1992 | Marchese et al. | 252/171 |

FOREIGN PATENT DOCUMENTS

| | | |
|---|---|---|
| 0316726 | 5/1989 | European Pat. Off. |
| 0354027 | 2/1990 | European Pat. Off. |
| 2564105 | 11/1985 | France |
| 61-033129 | 2/1986 | Japan |
| 4130197 | 5/1992 | Japan |
| 4130199 | 5/1992 | Japan |

OTHER PUBLICATIONS

*Merck's Chemical Index* p. 8890, definition of Terpineol–No. 8886 1976.
*Merck's Chemical Index* p. 7248, definitions of Pinene–No. 7242, Pine Oil–No. 7243, 1976.

*Primary Examiner*—Linda Skaling
*Attorney, Agent, or Firm*—Joseph W. Berenato, III

[57] ABSTRACT

The present invention relates to an aqueous based micellar solution in the form of a microemulsion which is an effective all-purpose cleaner and which has a flashpoint in excess of its boiling point which is typically greater than 212 degrees Fahrenheit.

19 Claims, No Drawings

HIGH TEMPERATURE FLASHPOINT, STABLE CLEANING COMPOSITION

This is a continuation of application Ser. No. 07/881,251, filed on May 11, 1992, now abandoned, which is a continuation-in-part of application Ser. No. 07/640,219, filed Jan. 11, 1991 now U.S. Pat. No. 5,112,516, issued May 12, 1992, A. Richard Koetzle for the invention entitled High Temperature Flashpoint, Stable Cleaning Composition.

BACKGROUND OF THE INVENTION

Many industrial process cleaning compositions have been based upon fluorinated and fluorinated/-chlorinated solvents. As ecological concerns have risen in importance, the search for replacements for such cleaners has attained increased importance. Several requirements exist for replacement cleaners including: cleaning efficacy, non-corrosiveness to metal parts, ease of use, and safety. Safety concerns raise several different requirements, including nontoxicity and high flashpoint. To date, no replacement cleaner has attained these properties.

Terpene hydrocarbons have been used for some time in general purpose cleaners, and in some specific formulations for specific industrial cleaning purposes, such as cleaning printed circuit boards or removal of graffiti. Those prior cleaners have relatively low flashpoints, typically well below their boiling point. Thus, basic problems associated with providing an effective and safe industrial cleaner have not been considered or solved using terpene hydrocarbon based cleaning compositions.

SUMMARY OF THE INVENTION

The present invention relates to an aqueous based micellar solution in the form of a microemulsion which is an effective all-purpose solvent and degreaser and which has a flashpoint in excess of its boiling point, typically greater than 212 degrees Fahrenheit.

A further aspect of the invention is a terpene hydrocarbon based cleaning composition which is admixed with an organic solvent, or which may be admixed with an organic solvent. An additional aspect of the invention involves the use of a terpene alcohol as a degreasing agent without requiring the solvents of the invention.

DETAILED DESCRIPTION OF THE INVENTION

The present invention relates to an improved cleaning composition which provides sufficient cleaning efficacy to be useful in many industrial applications which presently rely on fluorinated or chlorinated/-fluorinated solvents; and which has a flashpoint in excess of 200 degrees Fahrenheit. These improved cleaning compositions comprise:

5 to 35 weight percent terpene alcohol which has no significant amount of alpha pinene and beta pinene; and from 1 to 35 weight percent of a surfactant or combination of surfactants.

The surfactant or combination of surfactants can comprise up to 35 weight percent of the composition in total, and may be the combination of two or more different types of surfactants. A typical combination may comprise:

1.0 to 35 weight percent nonionic surfactant;
1.0 to 35 weight percent cationic, anionic or zwitterionic surfactant wherein both surfactant components do not include surfactants unreacted with ethylene oxide components. It is important that any surfactant used in the present invention not have free ethoxide components which are quite volatile and defeat the objective of obtaining a cleaning composition which is not combustible.

The compositions may also comprise from 0.1 to 25 weight percent terpene hydrocarbon which has been specially prepared so that no significant amount of alpha pinene or beta pinene are present in the terpene hydrocarbon component.

The compositions of the invention also include nonaqueous systems employing one or more organic solvents admixed with the terpene hydrocarbon.

The aqueous compositions are further characterized by being clear micellar solutions which are stable to phase changes and dilutions. Repeated freeze/thaw cycle experiments establish that the present cleaners do not break into two phase mixtures as many d-limonene based systems demonstrate. For instance, many terpene hydrocarbon/surfactant systems are emulsion systems which will become cloudy upon dilution with regular water. In some limonene and surfactant based systems dilution causes the cleaning solution to gel. In automated cleaning processes this can be a serious disadvantage as it may cause cleaning apparatus to fail, or the gels formed may not be removed from the article being cleaned.

The cleaning compositions of the present invention may be in the form of microemulsions. Microemulsions are two phase mixtures comprising an oil phase and a water phase. Regular emulsions appear cloudy or opaque because the size of the droplets of oil is larger than quarter wavelengths of white light, and thus scatter light rather than allowing it to pass through the mixture unscattered. Microemulsions have oil droplets less than about 10 microns in size and thus do not scatter light. They appear clear. Furthermore, microemulsions tend to be much more stable than regular emulsions. True microemulsions are easier to form from their constituent components than regular emulsions. Typically, emulsions require special equipment in order to be formed, such as ultrasonic mixers or emulsifiers which produce tremendous shear forces. The compositions of the present invention require only standard, non-shear mixing apparatus to be produced.

For purposes of this application the term terpene hydrocarbon shall be understood to include all compounds of the general structure:

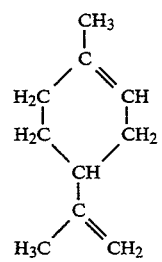

which are monocyclic terpenes, and acyclic terpenes. The terpene hydrocarbons used in the present invention are derived from a number of natural sources. Typically, the terpene hydrocarbon is a blend of naturally occurring terpene compounds. These compounds include the class of mono- or sesquiterpenes and mixtures thereof and can be acyclic or monocyclic in structure. Acyclic terpene hydrocarbons useful in the present invention include 2-methyl-6-methylene-2, 7-octadiene and 2, 6-dimethyl-2, 4, 6-octadiene. Monocyclic terpene hydrocarbons include terpinene, terpinolene and limonene classes and dipentene. While the examples provided here employ naturally occurring mixtures of these compounds, it is understood that pure samples of these compounds could be employed as well. When refined samples of naturally occurring terpene hydrocarbons are employed care must be taken to insure that no significant amount of alpha or beta pinene are present, or that any alpha or beta pinene are removed by means of distillation or filtering.

Specifically excluded from the term "terpene hydrocarbon" are bicyclic terpenes which include alpha and beta pinene, and terpene alcohols.

The term "terpene alcohol" is understood for purposes of the present invention to encompass compounds of the formulae:

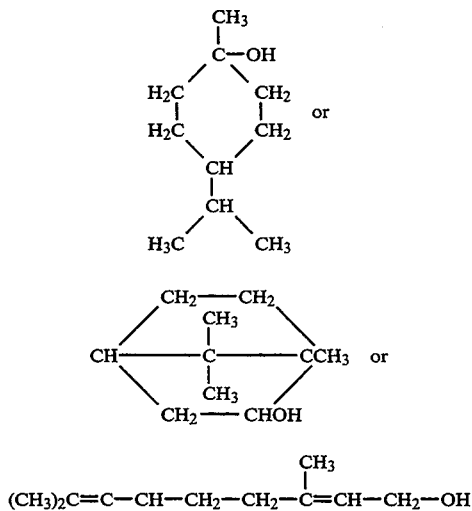

$$(CH_3)_2C=C-CH-CH_2-CH_2-\underset{\underset{CH_3}{|}}{C}=CH-CH_2-OH$$

which are monocyclic, bicyclic and acyclic alcohols, respectively. Terpene alcohols are structurally similar to terpene hydrocarbons except that the structures also include some hydroxy functionality. They can be primary, secondary, or tertiary alcohol derivatives of monocyclic, bicyclic or acyclic terpenes as well as the above. Such tertiary alcohols include terpineol which is usually sold commercially as a mixture of alpha, beta, and gamma isomers. Linalool is also a commercially available tertiary terpene alcohol. Secondary alcohols include borneol, and primary terpene alcohols include geraniol. Terpene alcohols are generally available through commercial sources, however, one must take care in practicing this invention to insure that no significant amount of alpha pinene or beta pinene are present in the terpene alcohol source, or that care is taken to remove such pinenes.

As used herein, the term "no significant amount" of alpha pinene and beta pinene means a terpene hydrocarbon in which the quantity of alpha pinene or beta pinene present is insufficient to cause the flashpoint of the terpene hydrocarbon to be significantly below its boiling point. I estimate that the alpha pinene and beta pinene volume percentage in the raw alcohol should be less than about 0.5%, because otherwise a sudden and significant decrease in the flashpoint will be experienced.

Examples of nonionic surfactants which are employed include propylene oxide or ethylene oxide condensation products of higher aliphatic alcohols, alkyl phenols, carboxylic acids, amides, amines and sulphonamides. These well-known surfactants include the sorbitan esters of fatty acids having 10 to 22 carbon atoms; polyoxyethylene sorbitan esters of C10 to C22 fatty acids having up to 95 percent propylene oxide; polyoxyethylene sorbitol esters of C10 to C22 fatty acids, polyoxyethylene derivatives of fatty phenols having 6 to 20 carbon atoms and up to 95 percent propylene oxide; fatty amino and amido betaines having 10 to 22 carbon atoms; polyoxyethylene condensates of C10 to C22 fatty acids or fatty alcohols having up to 95 percent propylene oxide. Polyoxyethylene and polyoxypropylene analogs of the above surfactants can be used in the present invention as long as care is taken to insure that polyoxyethylene polymers or polyoxypropylene polymers which have not been completely reacted with the fatty acid portion of the surfactant. Most importantly, volatile oligomeric fractions must be absent from the surfactants used in the present invention. A convenient way this goal can be accomplished is by using oxypropylene analogs of the above mentioned species of surfactants where feasible.

Ionic surfactants employed include surfactants such as the alkylaryl sulfonates of 6 to 20 carbons in the alkyl group; C10 to C22 fatty acid soaps; C10 to C22 fatty sulfates; C10 to C22 alkyl sulfonates; alkali metal salts of dialkyl sulfosuccinates; C10 to C22 fatty amine oxides; fatty imidazolines of C6 to C20 carbon atoms; fatty amido sulfobetaines having 10 to 22 carbon atoms; quaternary surfactants such as the fatty ammonium compounds having 10 to 22 carbon atoms; C10 to C22 fatty morpholine oxides; alkali metal salts of carboxylated ethoxylated C10 to C22 alcohols having up to 95 percent propylene oxide; propylene oxide condensates of C10 to C22 fatty acid monoesters of glycerins having up to 95 percent of propylene oxide; the mono- or diethanol amides of C10 to C22 fatty acids; and alkoxylated siloxane surfactants containing propylene oxide units and/or propylene oxide units; and phosphate esters, etc.

As is well-known in the field of surfactants, the counter ion in the case of anionic surfactants may be any of the alkali metals, ammonia, or substituted ammonias such as trimethylamine or triethanol amine. Usually ammonium, sodium and potassium are preferred. In the case of cationic surfactants, the counter ion is usually a halide, sulfate, or methosulfate, the chlorides being the most common industrially available compounds. The foregoing compounds have been described with particular reference to fatty derivatives. It is the fatty moiety usually forming the lipophilic moiety. A common fatty group is an alkyl group of natural or synthetic origin.

In most instances, the alkyl group may be replaced by the corresponding ethylenically saturated group having one or more ethylene linkages such as commonly occurs in nature. Common unsaturated groups are oleyl, linoleyl, decenyl, hexadecenyl, dodecenyl, etc. In appropriate cases, as known in the art, the alkyl group may be cyclic, i.e., cycloalkyls, or may be straight or branched chain. Other suitable surfactants include sorbitol monolaurate-propylene oxide condensates; sorbitol monomyristate-propylene oxide condensates; sorbitol monostearate-propylene oxide condensates; dodecylphenol-propylene oxide condensates; myristylphenol-propylene oxide condensates; octylphenyl-propylene oxide condensates; nonylphenyl-propylene oxide condensates; stearylphenol-propylene oxide condensates; lauryl alcohol-propylene oxide condensates; stearyl alcohol-propylene oxide condensates; secondary alcohol-propylene oxide condensates such as C14-C15 secondary alcohols condensed with propylene oxide; decyl amino betaine; coco amido sulfobetaine; oleyl amido betaine; coco imidazoline; coco sulfoimidazoline; cetyl imidazoline; 1-hydroxyethyl-2-heptadecenyl imidazoline; 1-hydroxyethyl-2-mixed heptadecenyl heptadecadienyl imidazoline; n-coco morpholine oxide; decyl dimethyl amine oxide; coco amido dimethyl amine oxide; sorbitan tristearate condensed with propylene oxide; sorbitan trioleate condensed with propylene oxide; sorbitan trioleate; sodium or potassium dodecyl sulfate; sodium or potassium stearyl sulfate; sodium or potassium dodecyl benzene sulfonate; sodium or potassium stearyl sulfonate; triethanol amine salt of dodecyl sulfate; trimethyl dodecyl ammonium chloride; trimethyl stearyl ammonium methosulfate; sodium laurate; sodium or potassium myristate; and sodium or potassium stearate.

Optionally, the cleaning compositions of the present invention may also include a suitable solvent for specific cleaning purposes. Such solvents include n-methyl pyrrolidone, dipropylene glycol and ethylene glycol monobutyl ether.

All of the chemical components used in the present invention are commercially available.

EXAMPLES

The following examples illustrate certain aspects of the present invention. They are not intended to exemplify the full scope of the invention. In certain aspects they enable certain aspects of the invention.

Example 1

The following ingredients in the following proportions were combined and mixed:

| Ingredient | Volume | Wt. % |
| --- | --- | --- |
| H$_2$O | 175 | 35.0 |
| monoethanolamine | 7.5 | 1.5 |
| dodecylbenzene sulfonic acid | 13.0 | 2.6 |
| nonylphenoxy polyethoxy ethanol | 38.5 | 7.7 |
| dipropylene glycol | 38.5 | 7.7 |
| sodium xylene sulfonate | 11.5 | 2.3 |
| e.d.t.a. | 4.0 | 0.8 |
| terpeniol | 62.0 | 12.4 |
| assorted terpene alcohols | 35.0 | 7.0 |
| n-methyl pyrrolidone | 115 | 23.0 |
| | | 100.0% |

The combination was clear and stable. When tested it exhibited a flashpoint in excess of 212 degrees Fahrenheit. In fact, it exhibited no flashpoint below the boiling point of the composition.

Example 2

A mixture of the following components:

| Ingredient | Volume | Wt. % |
| --- | --- | --- |
| H$_2$O | 545 | 54.2 |
| monoethanolamine | 20 | 2.0 |
| dodecylbenzene sulfonic acid | 35.0 | 3.5 |
| nonylphenoxy polyethoxy ethanol | 100 | 10.0 |
| terpeniol | 93.0 | 9.3 |
| assorted terpene alcohols | 52.5 | 6.0 |
| n-methyl pyrrolidone | 150 | 15.0 |

The components formed a clear microemulsion with mixing. The composition had a flashpoint in excess of 212 degrees Fahrenheit.

Example 3

| Ingredient | Volume | Wt. % |
| --- | --- | --- |
| terpeniol | 200 | 33.33 |
| n-methyl pyrrolidone | 200 | 33.33 |
| dipropylene glycol | 200 | 33.33 |

This clear mixture was clear, stable and had a flashpoint in excess of 212 degrees Fahrenheit.

Example 4

Another sample was made with the following composition:

| Ingredient | Volume (ml) | Wt. % |
| --- | --- | --- |
| H$_2$O | 470 | 47.0 |
| dodecyl benzene sulfonic acid | 35.5 | 3.5 |
| ethylene glycol monobutyl ether (EB) | 100 | 10.0 |
| Rexol 25/10 | 100 | 10.0 |
| sodium xylene sulfonate | 30 | 3.0 |
| e.d.t.a. | 10 | 1.0 |
| terpeniol | 250 | 25.0 |
| 1 N NaOH | 4.5 | 0.5 |
| | | 100.0% |

The solution was adjusted to a pH between about 6 and 8. This solution was clear and stable. The solution did not flash below its boiling point.

Examples 5-7

Clear stable microemulsions of the following formulations were made, all of which displayed flashpoints in excess of 212 degrees Fahrenheit.

Example 5

| Ingredient | Volume (ml) | Wt. % |
| --- | --- | --- |
| H$_2$O | 415 | 41.5 |
| monoethanolamine | 15 | 1.5 |
| dodecylbenzene sulfonic acid | 26 | 2.6 |
| nonylphenoxy polyethoxy ethanol | 77 | 7.7 |
| dipropylene glycol | 77 | 7.7 |
| sodium xylene sulfonate | 30 | 3.0 |
| ethylene diamine tetraacetic acid | 10 | 1.0 |
| terpeniol | 250 | 25.0 |
| n-methyl pyrrolidone | 100 | 10.0 |

Example 6

| Ingredient | Volume (ml) | Wt. % |
|---|---|---|
| $H_2O$ | 545 | 54.5 |
| monoethanolamine | 15 | 1.5 |
| dodecylbenzene sulfonic acid | 26 | 2.6 |
| sodium metasilicate | 10 | 1.0 |
| nonylphenoxy polyethoxy ethanol | 77 | 7.7 |
| dipropylene glycol | 77 | 7.7 |
| sodium xylene sulfonate | 30 | 3.0 |
| ethylene diamine tetraacetic acid | 10 | 1.0 |
| terpeniol | 150 | 15.0 |
| n-methyl pyrrolidone | 50 | 5.0 |

Example 7

| Ingredient | Volume (ml) | Wt. % |
|---|---|---|
| $H_2O$ | 495 | 49.5 |
| monoethanolamine | 15 | 1.5 |
| dodecylbenzene sulfonic acid | 26 | 2.6 |
| sodium metasilicate | 10 | 1.0 |
| nonylphenoxy polyethoxy ethanol | 77 | 7.7 |

| Ingredient | Volume (ml) | Wt. % |
|---|---|---|
| dipropylene glycol | 77 | 7.7 |
| sodium xylene sulfonate | 30 | 3.0 |
| ethylene diamine tetraacetic acid | 10 | 1.0 |
| terpeniol | 200 | 20.0 |
| n-methyl pyrrolidone | 50 | 5.0 |

The preceding Examples 1-7 were directed principally to aqueous based cleaning compositions. These compositions are environmentally improved over prior cleaning compositions because the terpene hydrocarbons are naturally occurring materials which are biodegradable. Particularly applications, however, may not be practical for use with an aqueous system and I have therefore developed a composition utilizing water miscible organic solvents in admixture with the terpene hydrocarbon.

I prefer that the organic solvents be water miscible in order to facilitate the cleaning of spills, and to minimize the possible contamination to ground water supplies in the event of a spill or leakage. Furthermore, because the solvents and the terpene hydrocarbon are water miscible, then the cleaning composition may be produced so as to be mixed with water by the user.

A preferred terpene hydrocarbon is produced by Technical Ltd. of Anacortes, Washington. The terpene alcohol had a product name of Terpene Alcohols 95%, and had the following analysis by gas liquid chromatography:

| | |
|---|---|
| Alpha fenchone | 2.1% |
| Terpinen-4-OL | 1.0% |
| Cis-beta-terpineol | 1.9% |
| Isoborneol | 0.6% |
| Trans-beta terpineol | 1.4% |
| Alpha terpineol | 91.4% |
| Total terpene alcohols | 98.8% |

I have found that commercially available terpene alcohols actually are a mixture of various alcohols. The alcohol types and percentages may also be related to the starting composition from which the alcohol is produced. Many terpene alcohols are produced from wood waste and I have found, for example, that the terpene hydrocarbon produced from trees originating in Brazil have a lower concentration of the alpha and/or beta pinenes than those originating in Florida.

Formulation of the composition as set out in Example 1 with the above-identified Tecnal Ltd. material resulted in a cleaning composition with a flashpoint above the boiling point of 220° F. The flashpoint test was based upon the closed cup method recommended by the Department of Transportation at 49 Code of Federal Regulations, Chapter I, §173.115(d)(i)(A). Formulation into an organic composition as set forth below in Example 8 resulted in a composition with a flashpoint of 207° F. and a Kb value in excess of 500.

I have found that terpene alcohols containing 95% to 100% terpene alcohol, when substantially free of the alpha and beta pinenes or other impurities adversely affecting the flashpoint, can be formulated to produce a terpene based solvent as a microemulsion or an organic solvent blend having flashpoints in excess of 200° F. and with very low trace odor. The odor of prior terpene compositions was quite distinctive, required ventilation, and adversely impacted use of those formulations. The disclosed formulations exhibit little or none of the trace odor. In addition, because the flashpoint of the disclosed compositions exceed 200° F. then they may be safely transported and landfilled.

The purified terpene alcohols may be blended in any proportion with other solvents, diluents, and thinners to produce a non-aqueous solvent blend which has a flashpoint in excess of 200° F. and a faint low or trace terpene odor. Solvent blends may be developed with specific properties based upon specific applications. Suitable organic solvents include mineral based oil, tridecyl alcohol, ethylene glycol, propylene glycol, diethylene glycol, dipropylene glycol, triethylene glycol, tripopylene glycol, glycerine, monoethanolamine, monoisopropanolamine, diethanolamine, triethanolamine, di-tri-isopropanolamine, dibasic ester, glycol ether acetate DE, glycol ether acetate DB, isophorone, glycol ethers and n-methyl pyrrolidone.

Example 8

| Ingredient | Volume % |
|---|---|
| N-methyl pyrrolidone | 33.3% |
| Dipropylene glycol | 33.3% |
| Terpene alcohol | 33.3% |

The composition of Example 8 had a flashpoint in excess of 207° F., and exhibited little of the distinctive terpene odor. The composition of Example 8 utilized the Tecnal Ltd. alcohol as the terpene alcohol.

Example 9

| Ingredient | Volume % |
|---|---|
| n-methyl pyrrolidone | 33.3% |

-continued

| Ingredient | Volume % |
|---|---|
| Dipropylene glycol | 33.3% |
| Glidcol 95 (terpene hydrocarbon) | 33.3% |

Glidcol 95 is a commercially available terpene alcohol sold by Glidco Chemical. Glibcol 95 contains alpha terpinene, among other terpene hydrocarbons and terpene alcohols, and exhibits a flashpoint of between 180° F. and 195° F. depending upon the volatile impurities present. The flashpoint of Glidcol 95 may be increased to over 212° F. by increasing the temperature of the product to 200° F. for approximately five (5) minutes, sufficient time for the volatile impurities, including the alpha and beta pinenes, to be driven off. Example 9 was allowed to sit for more than six (6) months, and even then exhibited a flashpoint in excess of 212° F.

Commercially available terpene alcohols may contain a significant amount of terpene hydrocarbon impurities. The impurities include not only the alpha and beta pinenes, but also limonene, dipentene, terpinene, terpinolene, menthere, myrcene, sabinene, oneimene, thellandrene and mixtures thereof. The compositions of the invention require that the terpene hydrocarbon have no significant amount of these impurities, so that the flashpoint is high and there is little or no trace odor.

In the event a solvent formulation is used, such as Example 8, then I prefer that the solvents likewise have a relatively high flashpoint. According to the Condensed Chemical Dictionary, 1956 Edition, Reinhold Publishing Company, n-methyl pyrrolidone has a flashpoint of 204° F. and dipropylene glycol has a flashpoint of 280° F.

Those skilled in the art will recognize that the terpene alcohols may themselves be used to remove grease and other contaminants from various materials, such as steel. The terpene alcohol, without solvents and surfactants, may be contained within a tank into which the material to be cleaned is placed. Heating of the terpene alcohol may not be needed, depending upon the application, although because of the high flashpoint, heating may be useful. Should the terpene alcohol bath become too concentrated with dissolved grease, then the bath may be disposed of or the grease separated from the alcohol by various means, including membrane filtration.

While this invention has been described as having a preferred design, it is understood that it is capable of further modifications, uses and/or adaptations of the invention, following the general principle of the invention and including such departures from the present disclosure has come within known or customary practice in the art to which the invention pertains, and as may be applied to the central features hereinbefore set forth, and fall within the scope of the invention of the limits of the appended claims.

I claim:

1. A non-combustible solvent composition comprised of:
   a) at least a first solvent other than terpineol having a flashpoint in excess of 200° F; and
   b) admixed with said first solvent an effective amount for solvent purposes of terpineol containing no significant amount of alpha and beta pinene wherein the flashpoint of said terpineol is at least about 212° F.

2. The composition of claim 1 wherein:
   a) said first solvent is miscible in water.

3. The composition of claim 1, wherein:
   a) a second solvent other than terpineol or said first solvent having a flashpoint in excess of 200° F. is admixed with said terpineol.

4. The composition of claim 3 wherein:
   a) each of said first and second solvents is soluble in water.

5. The composition of claim 3 wherein:
   a) each of said first and second solvents is an organic material.

6. The composition of claim 5 wherein:
   a) one of said solvents is n-methyl pyrrolidone and the other of said solvents is dipropylene glycol.

7. The composition of claim 3 wherein:
   a) said first and second solvents and said terpineol are each present in the composition in equal volume percentages.

8. The composition of claim 1, wherein:
   a) said terpineol has been devolatized by heating to and being maintained for a sufficient time at a temperature sufficient to drive off any significant amount of alpha and beta pinene.

9. A non-combustible industrial solvent, comprising:
   a) first and second organic solvents, other than terpineol each said organic solvent having a flashpoint in excess of 200° F.; and
   b) an effective amount for solvent purposes of terpineol admixed with said solvents and containing no significant amount of alpha and beta pinenes so that the flashpoint of said terpineol is at least about 212° F.

10. An industrial solvent of claim 9, wherein:
    a) each of said organic solvents is miscible in water.

11. An industrial solvent of claim 9, wherein:
    a) there is an equal volume percentage of each of said organic solvents in the non-combustible industrial solvent.

12. An industrial solvent of claim 11, wherein:
    a) each of said organic solvents are present in the non-combustible industrial solvent in a volume percentage equal to the volume percentage of said terpineol.

13. An industrial solvent of claim 9, wherein:
    a) said terpineol contains from about 95% by volume to about 100% by volume of said terpineol.

14. An industrial solvent of claim 9, wherein:
    a) said first solvent is n-methyl pyrrolidone and said second solvent is dipropylene glycol.

15. A high flashpoint water soluble composition, comprising:
    a) a solvent system other than terpineol miscible in water and having a flashpoint in excess of 200° F.; and
    b) an effective amount for solvent purposes of terpineol containing no significant amount of alpha and beta pinenes and having a flashpoint of at least about 212° F.

16. A water soluble composition of claim 15, wherein:
    a) said solvent system comprises a blend of at least two organic solvents.

17. A water soluble composition of claim 16, wherein:
    a) each of said solvents is present in a volume percentage equal to the volume percentage of said terpineol.

18. A water soluble composition of claim 17, wherein:

a) one of said solvents is n-methyl pyrrolidone and the other of said solvents is dipropylene glycol.

19. A method of removing grease and soluble contaminants from articles, comprising the steps of:
   a) providing an article having a contaminant thereon; and
   b) removing the contaminant by applying to the contaminant a sufficient quantity of a terpineol which has no significant amount of alpha and beta pinene so that the flashpoint of said terpineol is at least about 212° F.

* * * * *